US006828605B2

(12) United States Patent
Eisele et al.

(10) Patent No.: US 6,828,605 B2
(45) Date of Patent: Dec. 7, 2004

(54) FIELD-EFFECT-CONTROLLED SEMICONDUCTOR COMPONENT AND METHOD OF FABRICATING A DOPING LAYER IN A VERTICALLY CONFIGURED SEMICONDUCTOR COMPONENT

(75) Inventors: Ignaz Eisele, Icking (DE); Walter Hansch, Tegernbach (DE); Christoph Fink, München (DE); Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/013,997

(22) Filed: Dec. 11, 2001

(65) Prior Publication Data

US 2002/0125532 A1 Sep. 12, 2002

(30) Foreign Application Priority Data

Dec. 11, 2000 (DE) .......................................... 100 61 529

(51) Int. Cl.[7] .............................................. H01L 29/76
(52) U.S. Cl. ....................... 257/213; 257/288; 257/342; 257/404; 257/487
(58) Field of Search ................................. 257/392, 403, 257/404, 213, 288, 342, 487, 20, 24, 101, 192, 548, 341, 333

(56) References Cited

U.S. PATENT DOCUMENTS

| | | | |
|---|---|---|---|
| 4,395,725 A | * | 7/1983 | Parekh ........................ 357/23 |
| 4,472,727 A | * | 9/1984 | Tewksbury ................. 357/23.1 |
| 4,754,310 A | | 6/1988 | Coe |
| 5,013,685 A | * | 5/1991 | Chiu et al. .................. 437/184 |
| 5,216,275 A | | 6/1993 | Chen |
| 5,355,008 A | | 10/1994 | Moyer et al. |
| 5,422,510 A | * | 6/1995 | Scharf et al. ............... 257/404 |
| 5,438,215 A | * | 8/1995 | Tihanyi ...................... 257/401 |
| 5,451,533 A | * | 9/1995 | Williams et al. ............. 437/41 |

(List continued on next page.)

FOREIGN PATENT DOCUMENTS

| | | |
|---|---|---|
| DE | 43 09 764 C2 | 1/1997 |
| EP | 1 054 450 A2 | 11/2000 |
| WO | WO 97/29518 | 8/1997 |

OTHER PUBLICATIONS

Muller et al. Device Electronics for Integrated Circuits, 1986, John Wiley & Sons, Second Edition, 443–454.*
V. Ramgopal Rao et al.: "Simulation, Fabrication and Characterization of High Performance Planar–Doped–Barrier Sub 100 nm Channel MOSFETs", Technical Digest IEDM, 1997, pp. 811–814.
Jens Peer Stengl et al.: "Leistungs–MOS–FET–Praxis" [power MOSFET practice], Pflaum Verlag, Munich, 2nd ed., 1992, p. 44.
B. Jayant Baliga: "Power Semiconductor Devices", PWS Publishing Company, Boston, 1996, pp. 10, 11, 18, 19, 362 and 363.

Primary Examiner—Mary Wilczewski
Assistant Examiner—Monica Lewis
(74) Attorney, Agent, or Firm—Laurence A. Greenber; Werner H. Stemer; Ralph E. Locher

(57) ABSTRACT

A field-effect-controllable semiconductor component has at least one source zone and at least one drain zone of a first conductivity type, and at least one body zone of a second conductivity type. The body zone is provided between the source zone and the drain zone. In each case at least a first and a second region of the second conductivity type are provided in a channel zone. The first region has a first doping concentration and the second region has a second doping concentration, which is lower than the first doping concentration. The combination of the two regions produces a semiconductor component threshold voltage greater than zero and the on resistance is lower than that merely due to a channel zone doped with the first or second doping concentration.

21 Claims, 4 Drawing Sheets

U.S. PATENT DOCUMENTS

| | | | | |
|---|---|---|---|---|
| 5,475,245 A | * | 12/1995 | Kudo et al. | 257/288 |
| 5,510,635 A | * | 4/1996 | Nuyen | 257/195 |
| 5,536,957 A | * | 7/1996 | Okumura | 257/336 |
| 5,543,654 A | * | 8/1996 | Dennen | 257/386 |
| 5,569,943 A | * | 10/1996 | Koscica et al. | 257/192 |
| 5,606,184 A | * | 2/1997 | Abrokwah et al. | 257/192 |
| 5,714,781 A | * | 2/1998 | Yamamoto et al. | 257/329 |
| 5,731,611 A | * | 3/1998 | Hshieh et al. | 257/341 |
| 5,751,045 A | * | 5/1998 | Choi et al. | 257/392 |
| 5,753,958 A | * | 5/1998 | Burr et al. | 257/392 |
| 5,760,435 A | * | 6/1998 | Pan | 257/314 |
| 5,786,620 A | * | 7/1998 | Richards, Jr. et al. | 257/408 |
| 5,793,055 A | * | 8/1998 | Kastalsky | 257/24 |
| 5,912,488 A | * | 6/1999 | Kim et al. | 257/316 |
| 5,945,708 A | * | 8/1999 | Tihanyi | 257/331 |
| 5,998,833 A | * | 12/1999 | Baliga | 257/329 |
| 6,184,555 B1 | * | 2/2001 | Tihanyi et al. | 257/342 |
| 2001/0000625 A1 | * | 5/2001 | Yaegashi et al. | 257/296 |
| 2002/0063281 A1 | * | 5/2002 | Tihanyl | 257/328 |
| 2002/0117715 A1 | * | 8/2002 | Oppermann et al. | |

* cited by examiner

FIELD-EFFECT-CONTROLLED SEMICONDUCTOR COMPONENT AND METHOD OF FABRICATING A DOPING LAYER IN A VERTICALLY CONFIGURED SEMICONDUCTOR COMPONENT

BACKGROUND OF THE INVENTION

Field of the Invention

The invention relates to a field-effect-controllable semiconductor component which is provided in a semiconductor body. The semiconductor component has at least one source zone and at least one drain zone of a first conductivity type. The semiconductor component has at least one body zone of a second conductivity type. The body zone is provided between the source zone and the drain zone. The semiconductor component has at least one gate electrode, which is insulated from the semiconductor body through the use of a dielectric and via which a channel zone can be formed in the body zone when a gate potential is applied to the gate electrode. The invention also relates to a method of fabricating the semiconductor component.

Such a field-effect-controllable semiconductor component is, for example, the MOS (Metal Oxide Semiconductor) transistor, or MOSFET (Metal Oxide Semiconductor Field Effect Transistor) for short. The construction and the method of operation of a MOSFET is known and requires no further explanation.

A MOSFET typically functions as a controllable switch and should therefore have the smallest possible ohmic resistance in the on state. In actual fact, however, MOSFETs in the on state have a non-negligible so-called "on resistance." In accordance with J. P. Stengl, J. Tihanyi, Leistungs-MOS-FET-Praxis [Power MOS-FET technology], Pflaum-Verlag Munich, 1992, page 44, the on resistance $R_{ON}$ has the following composition:

$$R_{ON}=R_K+R_S+R_{CH}+R_{AKJ}+R_{EPI}+R_{SUB} \quad (1)$$

The individual resistance elements of the on resistance $R_{ON}$ in accordance with equation (1) are described briefly below: $R_K$ designates the contact resistance of the source electrode with respect to the semiconductor body at the front side of the wafer. The resistance $R_S$ is essentially determined by the doping concentration in the source region. $R_{AKJ}$ designates the so-called accumulation resistance, which is often also referred to as JFET (Junction Field Effect Transistor) resistance and results from the formation and mutual influencing of depletion regions of adjacent cells of a semiconductor component. $R_{EPI}$ designates the resistance caused by the doping concentration of the drift path—if present. In vertical semiconductor components, the drift path is usually realized by one or more epitaxial layers. In particular in high-blocking-capability semiconductor components having a blocking capability of several hundred volts, the resistance element $R_{EPI}$ contributes by far the greatest proportion of the on resistance $R_{ON}$, whereas it is often negligibly low in the case of components in the low-voltage range. $R_{SUB}$ designates the resistance of the substrate or of the drain region. Since the source resistance $R_S$ and the substrate resistance $R_{SUB}$ typically have a very high doping concentration, they are negligibly low relative to the other resistance elements.

$R_{CH}$ designates the channel resistance. The channel resistance results in the event of application of a gate potential and of a voltage between drain and source electrodes from the inversion current induced beneath the gate electrode. In accordance with B. J. Baliga, Power Semiconductor Devices, PWS-Publishing Company, page 362, the channel resistance $R_{CH}$ is defined as follows:

$$R_{CH} = \frac{L}{W \cdot \mu_{NS} \cdot C_{OX} \cdot (V_c - V_T)} \quad (2)$$

In equation (2), L and W designate the channel length and the channel width, respectively, $\mu_{NS}$ designates the mobility of the electrons in the channel region, $V_G$ and $V_T$ designate the gate potential and the thermal potential, respectively. $C_{OX}$ designates the oxide capacitance, which is essentially determined by the oxide thickness and also the doping concentration in the channel region. Given a predetermined transistor geometry—i.e. given a constant channel length L, channel width W and oxide capacitance—in a MOSFET the channel resistance is inversely proportional to the mobility $\mu_{NS}$.

The mobility is characterized on the one hand by scattering of the electrons contributing to the channel current with dopants in the channel region, and on the other hand by scattering of the electrons at the interface between the semiconductor body and the gate oxide. These scattering mechanisms, which are also represented on pages 10–11 and 18–19 in the abovementioned book by B. J. Baliga, brake the electrons and thus reduce the effective current density $J_{eff}$ in accordance with $$J_{eff}=n_{el}v_{el} \quad (3)$$

where $n_{el}$ and $v_{el}$ designate the number and velocity of the electrons. The effective mobility of the electrons decreases, as a result of which the channel resistance $R_{CH}$ increases undesirably in accordance with equation (2).

Furthermore, there are even further resistance elements that exist, for example mounting-governed resistances.

In order to minimize the power loss consumed by the semiconductor component itself, the on resistance $R_{ON}$ in accordance with equation (1) should be as small as possible. There are various measures for reducing the resistance elements, some of which measures are presented briefly below:

In order to reduce the source resistance $R_S$ and substrate resistance $R_{SUB}$, the doping concentration in these regions is typically increased as far as possible. Furthermore, in the case of vertical MOSFETs, the substrate resistance $R_{SUB}$ can be reduced by reducing the thickness of the drain region by thinning the semiconductor body by grinding from the rear side of the wafer.

In vertically configured MOSFETs, the epitaxial resistance $R_{EPI}$ can be greatly reduced by forming the semiconductor component as a compensation structure. Semiconductor components according to the compensation principle are described for example in U.S. Pat. No. 5,216,275 and U.S. Pat. No. 4,754,310 and also in International Publication No. WO 97/29518 and in German Patent No. DE 43 09 764 C2.

When a semiconductor component is formed with trench structures or so-called trenches in which the gate electrodes are provided, the parasitic JFET effect can be suppressed to the greatest possible extent, as a result of which the accumulation resistance $R_{AK}$ is minimized.

In particular in the case of so-called "smart power MOSFETs", which, as is known, are configured for very low voltages, the channel resistance $R_{CH}$ contributes by far the greatest proportion of the on resistance $R_{ON}$. A relationship between breakdown voltage and channel resistance is presented in D. A. Grant, J. Gowar, Power MOSFETs—Theory and Applications, J. Wiley & Sons, 1989, on page 76. By way of example, in the case of a MOSFET rated for a voltage between 50 V and 100 V, the channel resistance $R_{CH}$ makes up about 35% of the total on resistance $R_{ON}$. In the case of low-voltage MOSFETs having a much lower blocking capability of 20 V or 12 V, the channel resistance $R_{CH}$ even makes up a proportion of 60% or 80%, respectively, of the total on resistance $R_{ON}$.

In order to reduce the influence of the channel resistance $R_{CH}$, the transistor geometry—for example the channel length L, the channel width W and the oxide capacitance $C_{OX}$—can be varied as much as possible, with the assistance of equation (2). However, the transistor geometry of a semiconductor component is to a very great extent predetermined, so that optimization to that effect is possible only to a limited extent. With the exception of the above-mentioned optimization of the transistor geometry, however, further measures for reducing the channel resistance $R_{CH}$ are not known at the present time, so that low-voltage MOSFETs, in particular, have an on resistance that is greatly dependent on the channel resistance. This is a state which, understandably, should be avoided.

SUMMARY OF THE INVENTION

It is accordingly an object of the invention to provide a field-effect-controllable semiconductor component which overcomes the above-mentioned disadvantages of the heretofore-known components of this general type and which has a lower channel resistance in the on state whilst retaining the geometry of the semiconductor component.

With the foregoing and other objects in view there is provided, in accordance with the invention, a field-effect-controllable semiconductor configuration, including:

a semiconductor body;

a source zone and a drain zone of a first conductivity type disposed in the semiconductor body;

a body zone of a second conductivity type disposed between the source zone and the drain zone;

a gate electrode configured to form a channel zone in the body zone if a gate potential is applied to the gate electrode;

a dielectric insulating the gate electrode from the semiconductor body;

at least a first region and a second region of the second conductivity type provided in the channel zone;

the first region having a first doping concentration, the second region having a second doping concentration, the second doping concentration being lower than the first doping concentration;

the source zone, the drain zone, the body zone, and the gate electrode forming a semiconductor component having a threshold voltage and a given on resistance; and the first region and the second region being configured such that a combination of the first region and the second region results in the threshold voltage being greater than zero and in the given on resistance being lower than an on resistance resulting from a channel zone being doped with only one of the first doping concentration and the second doping concentration.

Accordingly, a generic field-effect-controllable semiconductor component provided in a semiconductor body is provided, in which in each case at least a first and a second region of the second conductivity type are provided, the regions being provided in the channel zone, in which the first region has a first doping concentration and the second region has a second doping concentration, which is lower than the first doping concentration, in which the combination of the two regions produces a semiconductor component threshold voltage greater than zero and the on resistance is lower than that merely due to a channel zone doped with the first or second doping concentration.

By virtue of the introduction of a highly doped doping layer according to the invention within the channel zone and by virtue of the reduction of the doping concentration in the channel region outside the doping layer, the scattering of the electrons at doping atoms in the channel region can essentially be limited to the region of the doping layer. In addition to this, it is also possible to restrict interface scattering to precisely this region, so that the interface scattering between semiconductor body and dielectric predominantly takes place in the doping layer. The reduction of the abovementioned scattering mechanisms to the region of the doping layer enables the surface mobility of the electrons contributing to the current flow in the channel region to be increased to a greater or lesser extent depending on doping conditions and layer thickness, which ultimately leads to a reduction in the channel resistance. In particular in those semiconductor components which have a very low breakdown voltage and in which the channel resistance thus makes a substantial contribution to the on resistance, the power dissipated in the semiconductor component can be significantly reduced by the abovementioned measure. It is thus possible to provide semiconductor components having a reduced chip area requirement, which is particularly advantageous in particular for economic reasons.

In contrast to a known DMOS (Diffusion Metal Oxide Semiconductor) transistor, in which, likewise, a doped layer of the same conductivity type as the channel zone outdiffuses from the source zone and adjoins the latter, the semiconductor component according to the invention is distinguished by a very sharply delimited doping layer provided in the channel region of the body zone. The layer thickness of this doping layer is typically very much smaller in relation to the channel length.

The doping concentration in the channel zone should ideally be as small as possible, so that a high switching speed is possible as a result of fast charge reversal. However, the doping must not be too low, since otherwise the semiconductor component loses its blocking capability in the off state. In order to ensure the blocking capability, the doping concentration should be as large as possible, but not too large, since otherwise the threshold voltage required for switching on the semiconductor component is too high. Semiconductor components of the generic type therefore have, even in the case of a DMOS structure, a very largely homogeneous doping concentration in the entire channel zone, which, depending on the application, offers a compromise for the doping concentrations just mentioned and, therefore, cannot achieve an improvement in the electron mobility and thus the on resistance.

In a complete departure from known semiconductor components, the semiconductor component according to the invention has, in the channel zone, two regions of the same conductivity type which are doped differently and typically also have different thicknesses. The doping concentration of these regions—or of at least one of these regions—is chosen in such a way that a threshold voltage brought about by the doping concentration of only one region lies outside the specified or intended threshold voltage. By way of example, the second region is doped so lightly that a corresponding semiconductor component is "normally on", that is to say is activated even in the off state. The first region is doped as highly as possible, so that such a semiconductor component has such a high threshold voltage that it could not be switched on under normal conditions. Only the combination or interaction of the two regions produces a semiconductor component with the desired threshold voltage. However, the semiconductor component is distinguished by a high blocking capability brought about by the highly doped region and, at the same time, by a high electron mobility, and hence a reduced on resistance, brought about by the lightly doped region.

In a highly advantageous embodiment, the doping layer is configured as a negligibly thin layer—generally also referred to as delta doping layer—in the channel zone. A negligibly thin layer thickness is to be understood to be a layer of one or a few atomic layers up to a few nanometers—for example up to 20 nm. In one embodiment, the doping layer has a doping density per unit area of more than $10^{11}$ $cm^{-2}$, advantageously in the range from $10^{12}$ $cm^{-2}$ to $10^{13}$ $cm^{-2}$. At any rate, however, the doping concentration in the delta doping layer should be chosen at least to have a magnitude such that the functionality of the semiconductor component, typically configured as a normally off MOSFET, is preserved. This means that the doping concentration in the delta doping layer suffices by itself to ensure the blocking capability of the channel zone and hence of the semiconductor component in the off state.

In a typical embodiment, the second region in the channel zone, that is to say the region outside the doping layer, has an approximately intrinsic doping concentration or a very much lower doping concentration than the doping layer. Typically, the doping concentration in the doping layer should not be greater than $10^{12}$ $cm^{-3}$ or should be at least a factor of 100 less than in the doping layer.

In a typical embodiment of the invention, the doping layer is provided within the channel zone in such a way that it divides the channel zone into a first and into at least one further channel zone region, the two channel zone regions being completely spaced apart from one another by the doping layer. As an alternative, it would also be conceivable for the doping layer to adjoin at least one of the source zones at least partially, advantageously completely with one of its surfaces.

In a typical embodiment of the invention, a surface of the doping layer is provided essentially perpendicularly to the current flow direction of the electrodes when a gate potential is applied. Typically, the doping layer has an extremely thin or its thinnest layer thickness precisely in the part in which the electron current is perpendicular to the two surfaces. These measures reduce the channel constriction to the layer thickness in the doping layer. It goes without saying that the electron current need not necessarily be perpendicular to one of the surfaces. However, the scattering of the electrons in the doping layer would then increase with an increasing angle deviating from the perpendicular, since the effective path length of the electrons in the doping layer increases. However, this would in turn lead to a higher on resistance.

The semiconductor component is typically configured as a MOS transistor (MOSFET), in particular as a normally off MOSFET. The invention can advantageously be used both in the case of a lateral transistor and in the case of a vertical transistor. In the case of a vertical transistor, the latter may be configured as a simple D-MOSFET, but also as a U-MOSFET or as a V-MOSFET. Furthermore, other transistor structures, such as, for example, MOSFETs fabricated using mesatechnology, would also be conceivable. In particular in the case of semiconductor components configured as a U-MOSFET or as a V-MOSFET, the components typically have trenches in which there are provided the gate electrodes insulated through the use of a dielectric.

The semiconductor component according to the invention can advantageously be embodied as a power semiconductor component as well. Such power semiconductor components typically have a drift zone between the body zone and the drain zone. In the case of laterally configured semiconductor components, this drift zone may be provided at the surface of the semiconductor body between body zone and drain zone. However, in particular for reasons of saving chip area, the drift zone is moved into the semiconductor body in contemporary semiconductor components so that the drift path is formed by an epitaxial layer formed in the semiconductor, which is applied in a large-area manner to the drain zone which makes contact with the semiconductor body at the rear side of the wafer. In the case of vertically configured semiconductor components, the drift zone is typically formed by one or more epitaxial layers which are in each case stacked "like a sandwich" between the drain zone and the body zone. Typically, but not necessarily, the drift path generally or the epitaxial layer specifically has a very much lower doping concentration than the respective drain zone.

In particular in semiconductor components which have a multiplicity of individual transistors provided in a cell array, it is possible to vary the current densities within the cell array in a targeted manner by varying the thickness of the doping layer. Such semiconductor components constructed in a cell-like manner typically have a cell array, in which the active cells or individual transistors are provided, and an edge region, in which a potential is to be reduced in order to protect the semiconductor component. By virtue of the invention, the current density can be reduced in a suitable manner, for example toward the edge of the cell array by suitably increasing the layer thickness of the doping layers provided in the respective channel zones and the risk of a voltage breakdown at the edge can thus be reduced.

The invention is suitable primarily in the case of so-called smart power components, that is to say in the case of semiconductor components which have a very low blocking capability and in which—as already mentioned in the introduction—the influence of the channel resistance if very large. The invention is particularly advantageous in the case of so-called short channel transistors or switching transistors which often do not have a drift region and in which the influence of the channel resistance in the total on resistance is thus the greatest.

With the objects of the invention in view there is also provided, a method of fabricating a doping layer in a vertically configured semiconductor component according to the invention, the method includes the steps of:

applying an epitaxial layer on a semiconductor body by using a thermal deposition process;

interrupting the thermal deposition process;

applying a thin doping layer of a given conductivity type by using a process selected from the group consisting of a vapor deposition process and a spinning-on process subsequent to cooling the semiconductor body; and applying a further epitaxial layer to the doping layer by using a thermal deposition process.

According to another mode of the invention, between the step of applying the thin doping layer and the step of applying the further epitaxial layer, a silicon layer is applied to a cooled surface of the semiconductor body.

According to another mode of the invention, the step of applying the epitaxial layer and the step of applying the further epitaxial layer are-performed at a high temperature, in particular above 500° C., and the step of applying the doping layer is performed substantially at room temperature.

Other features which are considered as characteristic for the invention are set forth in the appended claims.

Although the invention is illustrated and described herein as embodied in a field-effect-controlled semiconductor component and a method of fabricating such a component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
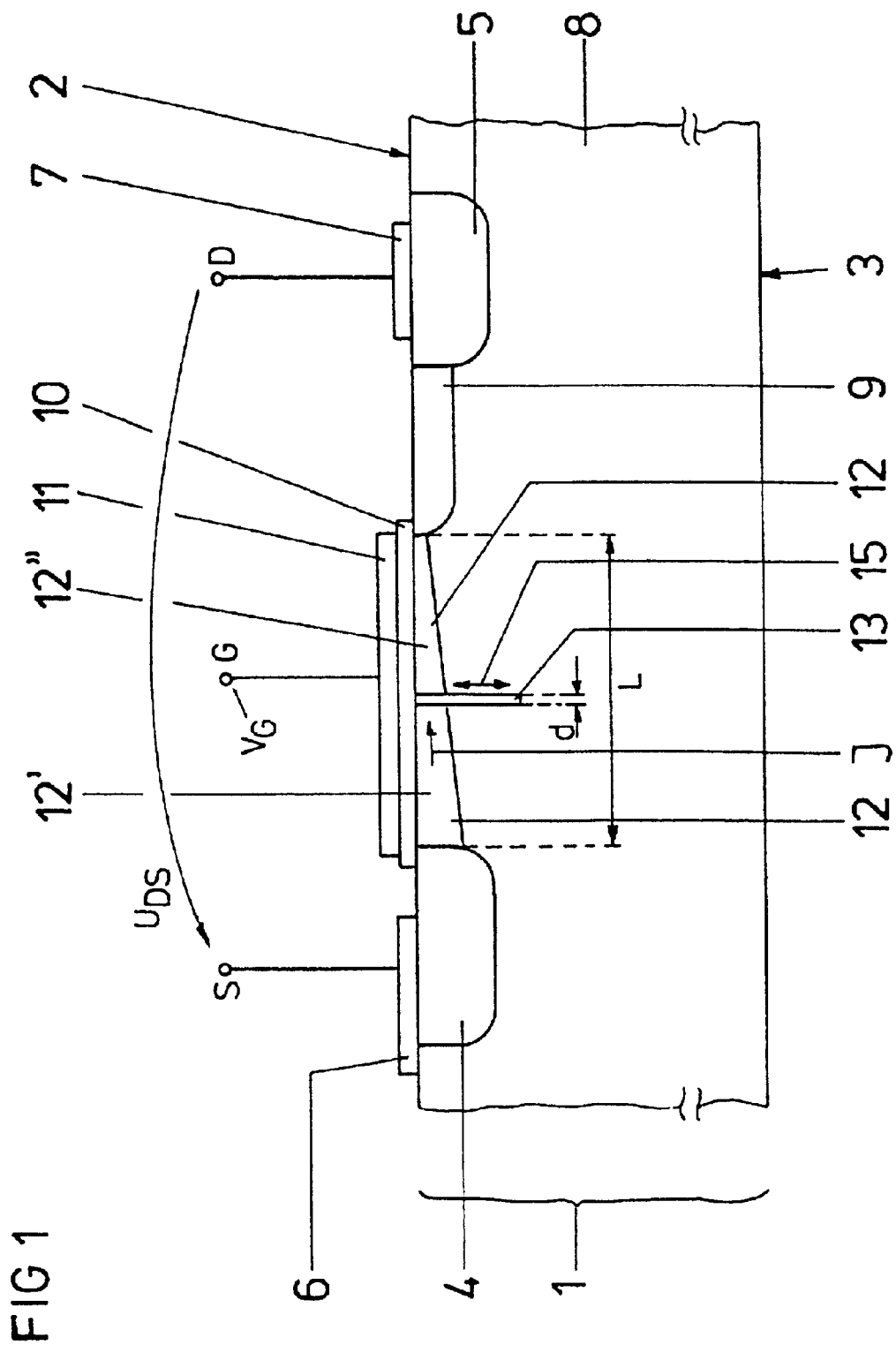
FIG. 1 is a diagrammatic, partial sectional view of a first exemplary embodiment of a semiconductor component according to the invention.

Referring now to the figures of the drawings in detail and first, particularly, to FIG. 1 thereof, there is shown a partial section through a first exemplary embodiment of a transistor according to the invention, which is configured as a lateral MOSFET there. In the figures of the drawings, unless specified otherwise, identical or functionally identical elements have been provided with the same reference symbols.

In FIG. 1, reference numeral 1 designates a semiconductor body, which is for example made of silicon. The semiconductor body 1 has a first surface 2 (front side of wafer) and a second surface 3 (rear side of wafer). A heavily n-doped source zone 4 and also a heavily n-doped drain zone 5 spaced apart from the source zone are in each case provided in the first surface 2. Electrically conductive contact is made with the source zone 4 via a source metallization layer 6 (source electrode), and electrically conductive contact is made with the drain zone 5 via a drain metallization layer 7 (drain electrode). A p-doped body zone 8 is provided between source zone 4 and drain zone 5. The lateral MOSFET illustrated in FIG. 1 is configured as a power MOSFET, i.e. it has a weakly n-doped drift zone 9 between body zone 8 and drain zone 5. A gate electrode 11 insulated from the semiconductor body 1 through the use of a dielectric 10 is provided in the region of the regions of the body zone 8 which emerge at the first surface 2. The gate electrode 11, the source electrode 6 and the drain electrode 7, which are respectively connected to the gate terminal G, the source terminal S and the drain terminal D, are spaced apart from one another at the first surface 2 and are insulated toward the outside through the use of a passivation layer, for example a field oxide, which is not shown in FIG. 1. In FIG. 1, the source terminal S additionally has the potential of the substrate of the semiconductor body 1.

When a positive gate potential $V_G$ is applied to the gate terminal G, an inversion channel forms in the regions of the body zone 8 which adjoin the first surface 2, which inversion channel forms the channel zone 12. According to the invention, a very heavily p-doped delta doping layer 13 is now provided, which is provided in the region of the channel zone 12 and which adjoins the first surface 2. In FIG. 1, the delta doping layer 13 is provided in the body zone 8 or in the channel zone 12 in such a way that the delta doping layer 13 subdivides the channel zone 12, in a spacing-apart manner, into two channel zone regions 12', 12". The body zone 8 and thus the channel zone 12 as well have a very low p-type doping concentration or an intrinsic doping in the regions 12', 12" outside the delta doping layer 13.

Figure 2:
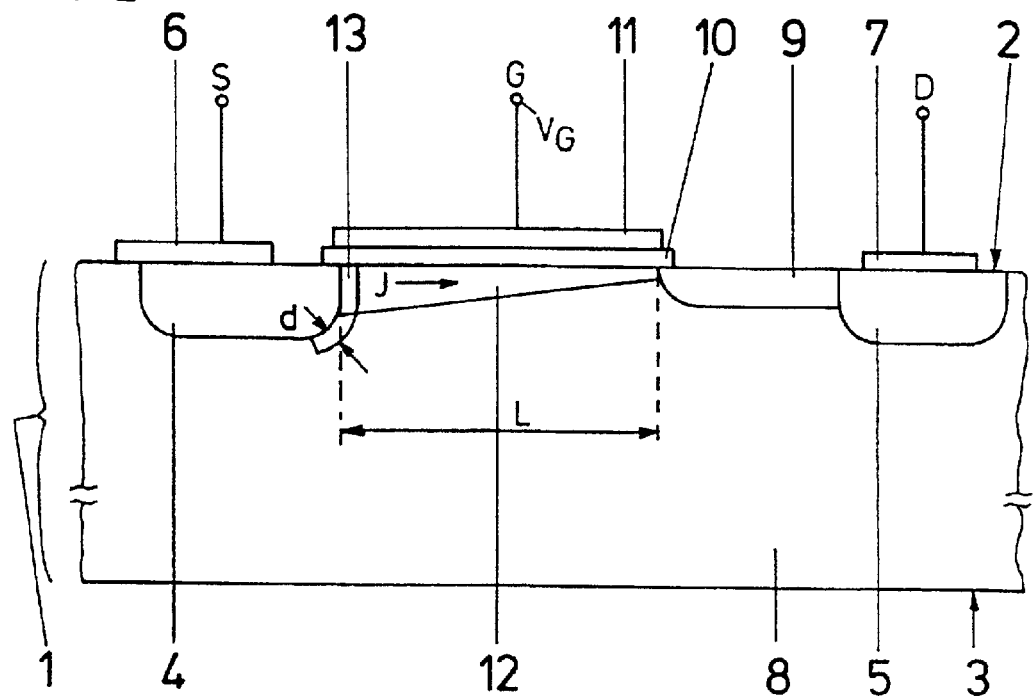
FIG. 2 is a diagrammatic, partial sectional view of a second exemplary embodiment of a semiconductor component according to the invention.

FIG. 2 shows a second exemplary embodiment of the semiconductor component according to the invention. In contrast to the MOSFET in FIG. 1, in this case the delta doping layer 13 directly adjoins the source zone 4.

The doping layer 13 in accordance with FIGS. 1 and 2 has a so-called delta doping. The term delta doping or delta doping layer refers to a doping layer having a thickness in the region of atomic layers. This delta doping has a very high doping concentration—in comparison with the body zone 8 1 surrounding it. Typically, the doping layer 13 has a doping density per unit area in the range between $10^{11}$ cm$^{-2}$ and $10^{14}$ cm$^{-2}$. By contrast, the lateral extent, i.e. the thickness d of the delta doping layer 13, is negligibly small in comparison with the channel length L. Typical layer thicknesses D of the delta doping layer 13 range from one or a few atomic layers up to a few nanometers.

Figure 3:
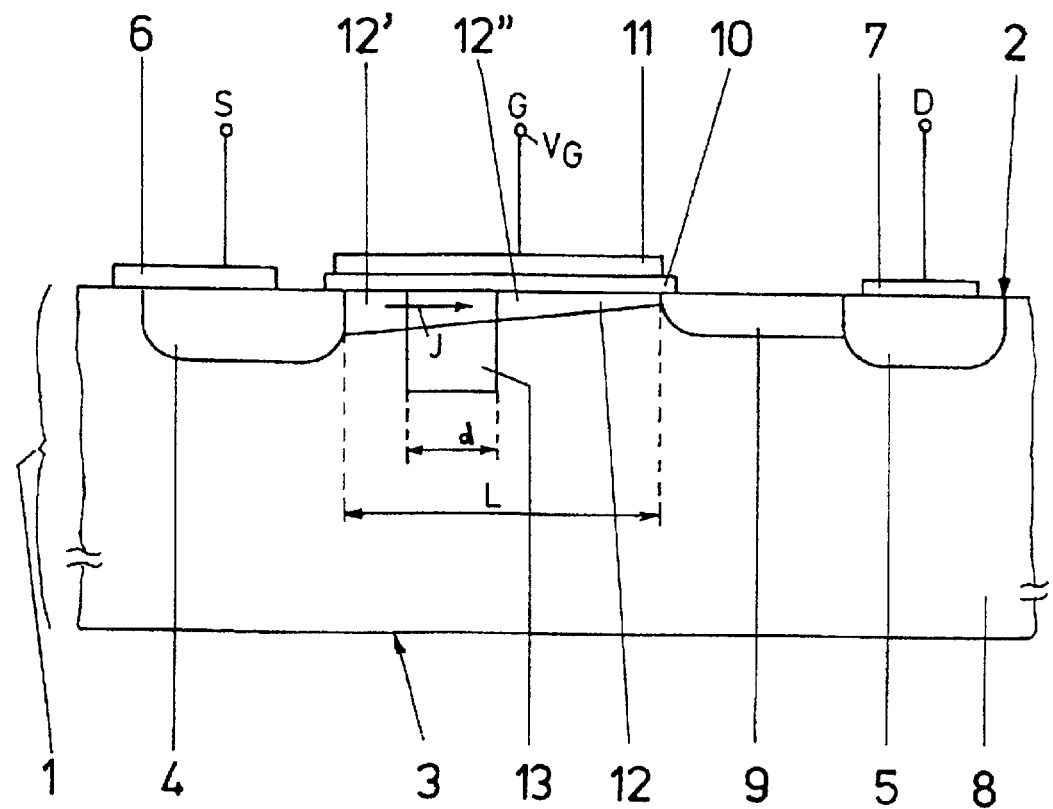
FIG. 3 is a diagrammatic, partial sectional view of a third exemplary embodiment of a semiconductor component according to the invention.

FIG. 3 shows, in a third exemplary embodiment, a modification of the partial section in accordance with FIG. 1. In this case, the doping layer 13 is not in the form of delta doping, rather it has a more or less arbitrary layer thickness d. The doping layer 13 has a higher doping concentration than the body zone 8 surrounding it, it likewise being provided more or less arbitrarily within the body zone 8 or the channel zone 12. What is essential to and particularly advantageous about this exemplary embodiment is that the doping layer 13 is not connected to the source zone 4, although this need not actually be precluded.

The method of operation of a semiconductor component according to the invention is described in more detail below with reference to FIGS. 1 to 2:

When a positive gate potential $V_G$ is applied to the gate terminal G and when there is a positive voltage $U_{DS}$ between source terminal S and drain terminal D, the inversion channel 12 forms—as already mentioned—and a current flow J occurs in the channel zone 12. In the exemplary embodiment in accordance with FIG. 1, the current flow J takes place essentially in the lateral direction from the source zone 4 via the channel zone 12, the drift zone 9 to the drain zone 5. The current flow J thus takes place essentially perpendicularly to the essentially lateral orientation 15 of the doping layer 13, which extends from the first surface 2 into the depth of the semiconductor body 1.

Figure 4:
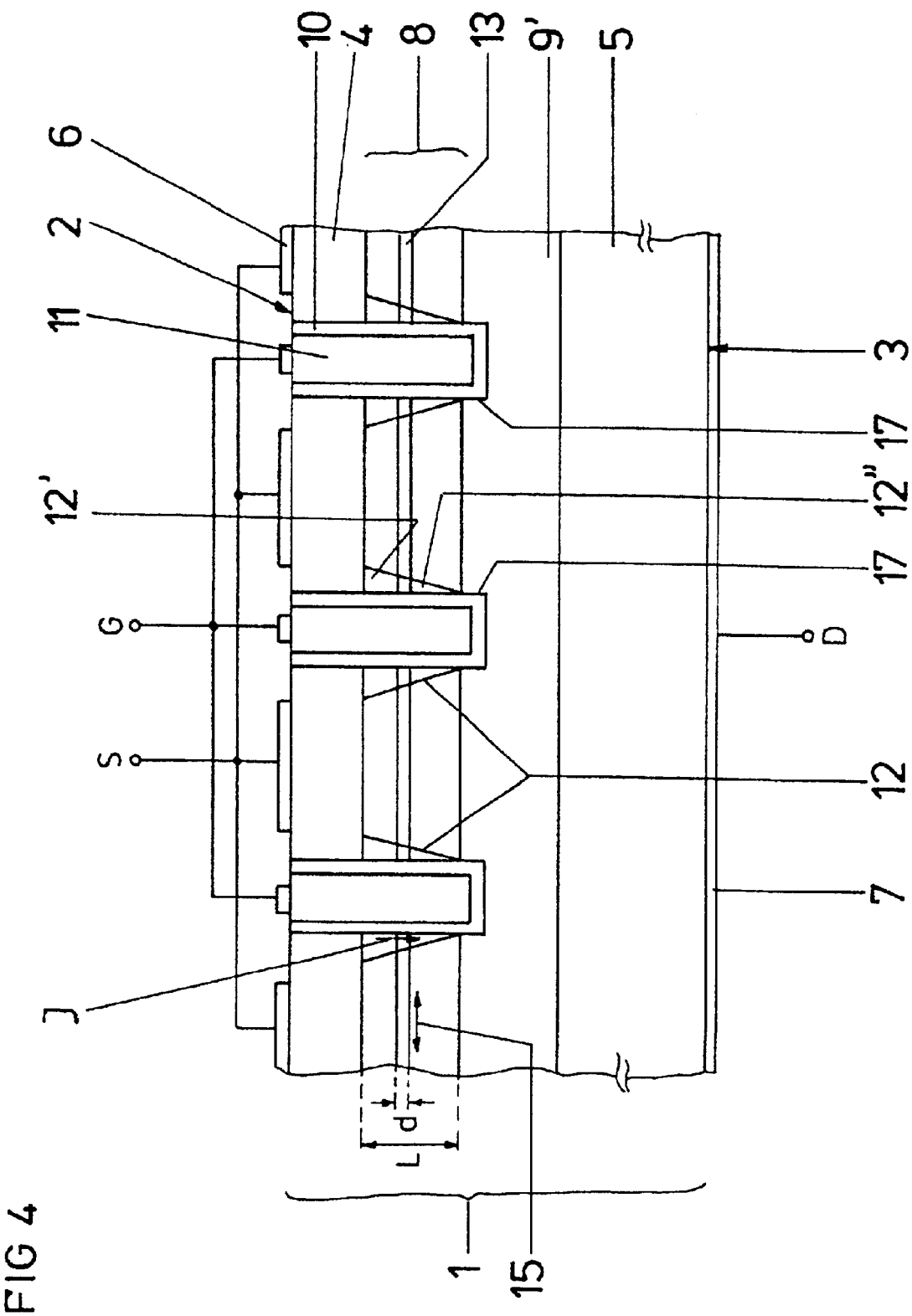
FIG. 4 is a diagrammatic, partial sectional view of a fourth exemplary embodiment of a semiconductor component according to the invention.

FIG. 4 shows a fourth exemplary embodiment of a semiconductor component according to the invention. The semiconductor component is in this case realized as a vertically configured MOSFET having a trench structure.

The semiconductor body 1 includes drain zone 5, epitaxial layer 9', body zone 8 and source zone 4 successively stacked on top of one another, the drain zone 5 joining the second surface 3 and being contact-connected there in a large-area manner through the use of the drain electrode 7. The source zone 4 adjoins the first surface 2 and is contact-connected there at least partially through the use of the source electrode 6.

In the exemplary embodiment of FIG. 4, provision is made of rectangular trenches 17 which extend essentially vertically into the semiconductor body 1 from the first surface 2 through the source zone 4, the body zone 8 right into the epitaxial layer 9'. The gate electrodes 11 insulated through the use of the dielectric 10 are provided in the trenches 17. The inversion channel which forms upon the application of a sufficiently positive gate and thus the channel zone 12 as well are in this case situated in the regions of the body zone 8 which adjoin the outer areas of the trenches 17.

In FIG. 4, the trenches 17 are introduced into the semiconductor body essentially in a rectangularly shaped manner. It goes without saying that the trenches can also be introduced into the semiconductor body 1 in a u-shaped manner, a v-shaped manner, in a trapezoidally shaped manner or more or less arbitrarily. The trenches 17 can be etched into the semiconductor body 1 in a known manner, for example through the use of a so-called "deep trench" method. Afterwards, the gate dielectric 10 is formed by thermal oxidation. Finally, a gate electrode 11 is introduced into the trenches 17, for example by deposition.

In FIG. 4, the delta doping layer 13 according to the invention is provided as a thin, very largely laterally oriented doping layer 13 within the body zone 8 and in each case extends over the entire width of the body zone 8. In the case of the vertically configured semiconductor component in FIG. 4, the current flow J takes place essentially in the vertical direction, i.e. from the source zone 4 via the channel zone 12 provided in the body zone 8, via the epitaxial layer 9' to the drain zone 5.

Figure 5:
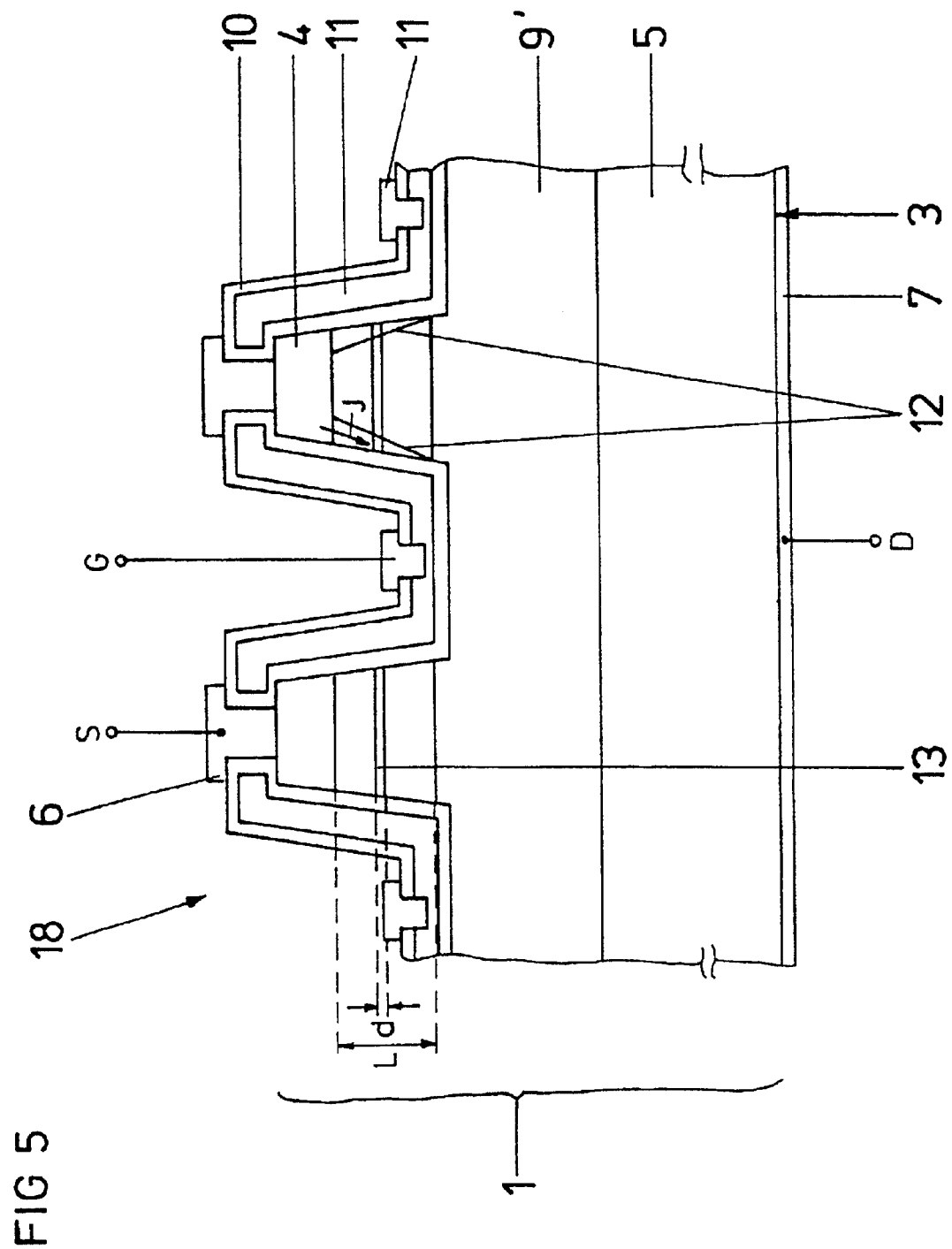
FIG. 5 is a diagrammatic, partial sectional view of a fifth exemplary embodiment of a semiconductor component according to the invention.

FIG. 5 shows a fifth exemplary embodiment of a semiconductor component according to the invention. In this case, a vertical MOSFET in a mesastructure is illustrated. The semiconductor component in accordance with FIG. 5 differs from that in FIG. 4 by the fact that in this case the body zone 8 and the source zone 4 stacked thereon have been constructed or produced using known mesatechnology. In mesatechnology, structures are etched out from the semiconductor body 1, as a result of which approximately tower-like, angular structures 18 project from the semiconductor body 1. In the present case, regions are etched out from the source zones 4 and body zones 8, so that the surfaces thereof emerge at the lateral areas of the so-called mesastructures 18. A gate electrode 11 insulated from the respective outer surfaces through the use of a dielectric 10 is constructed at the outer areas of the mesastructures. Finally, a region of the source zone 4 which emerges at the surface is contact-connected via a source electrode 6.

The basic method of operation of such mesacomponents is equivalent to that of the semiconductor components fabricated using trench technology in accordance with FIG. 4. In other words, in this case, too, a vertical channel zone 12 forms in the outer region of the body zone 8 when a positive gate potential is applied. In this case, too, the doping layer 13 according to the invention, which doping layer is in the form of delta doping, is oriented essentially in the lateral direction in an equivalent manner to the exemplary embodiment in FIG. 4.

In the exemplary embodiments of FIGS. 4 and 5, a delta doping layer in the body zone 8 is provided between two partial regions 12', 12" of the channel zone 12 in an equivalent manner to the lateral embodiment of FIG. 1. However, it would also be conceivable for the delta doping layer 13 to be directly connected to the source zone 4 in an equivalent manner to FIG. 2. Furthermore, it would also be conceivable for the doping layer 13 not to be in the form of delta doping and thus to have an arbitrary width within the body zone 8 or the channel zone 12.

In a semiconductor component of the generic type, the gate electrodes 11 typically include highly doped polysilicon. However, a different material, for example a metal or a silicide, can also be used for the gate electrodes 11, although these materials are not as advantageous as highly doped polysilicon in terms of fabrication technology and on account of their physical and electrical properties. Equally, instead of silicon dioxide ($SiO_2$), the dielectric 11 can also contain any other insulating material, for example silicon nitride ($Si_3N_4$), vacuum or a combination of the materials mentioned, but thermally fabricated silicon dioxide as gate oxide has the highest quality and is therefore preferable.

In the case of the lateral MOSFETs (FIGS. 1 to 3), the source zones 4, drain zones 5 and drift zones 9 which are provided therein and are typically embedded into the semiconductor body 1 in the form of wells have advantageously been produced by ion implantation and/or diffusion. The semiconductor layers of the vertical MOSFETs (FIGS. 4, 5) are typically applied to the semiconductor body 1 layer by layer by epitaxy. It would also be conceivable here for at least one of these layers to be produced by ion implantation and/or diffusion.

A number of advantageous methods for fabricating the (delta) doping layer 12 are described below depending on the type of semiconductor component:

(a) High-energy ion implantation: in order to produce lateral MOSFETs, a thick oxide is applied to the semiconductor body and is patterned through the use of electron beam writing. Afterwards, through the opening, the doping layer or the delta doping layer is produced, for example through multiple implantation at suitably chosen, different energies.

(b) Low-energy implantation: in order to produce vertical semiconductor components, doping ions are implanted into the body zone layer adjoining the surface, the implantation energy being set in such a way that the doping ions have a very small penetration depth of a few nanometers. Afterward, the remaining layers, for example a further body zone and/or the source zone, are deposited onto the delta doping in a known manner.

(c) Deposition: in order to fabricate a vertical semiconductor component, the surface of the body zone can be coated with a thin doping layer. After a short drive-in step at a suitable temperature, during which the dopants can diffuse into the regions of the body zone which are near the interface, the doping layer is etched away again. Afterward, the remaining layers, for example a further body zone and/or the source zone, are deposited onto the delta doping layer 13 in a known manner.

(d) Deposition: in the case of a vertical semiconductor component, the delta doping layer can be applied during the deposition process. By way of example, the dopant for the doping layer could be produced by momentarily increasing the doping dose virtually "in situ", that is to say during the fabrication process. As an alternative, the deposition process, which takes place at high temperatures of about 700° C., could also be interrupted. After the cooling of the semiconductor body, the doping element, for example boron, can then be applied at low temperatures and immediately be covered with silicon. Afterward, the deposition process can be continued at high temperature. The doping layer is then formed from the thin boron layer having a thickness of a few nanometers. The advantage for the application of the thin boron layer to the cold surface of the semiconductor body effects a better adhesion.

The invention is suitable in particular for all vertical and lateral semiconductor components configured as a MOSFET. However, the invention shall not be restricted exclusively to MOSFETs, but rather can be extended within the scope of the invention to any desired semiconductor components, for example JFETs, IGBTs and the like.

The invention shall not be restricted exclusively to the exemplary embodiments of FIGS. 1 to 5. Rather, a multiplicity of new component variants can be specified there, for example by interchanging the conductivity types n and p or by varying the doping concentrations, layer thicknesses and channel lengths. Furthermore, the highly doped doping layers provided in the channel zone need not necessarily be provided in the manner of FIGS. 1 to 5, but rather may be formed more or less arbitrarily within the body zone. The invention is furthermore suitable for semiconductor components with any desired breakdown voltages or dielectric strengths, i.e. for low-voltage and also for high-voltage applications, although the invention is at its most effective for components with a low blocking capability.

To summarize, it can be stated that, by virtue of the use of at least one highly doped (delta) doping layer in the region of the channel zone of a vertical or lateral semiconductor component and by virtue of a comparatively very low or intrinsic doping of the remaining regions of the channel zone, in a complete departure from semiconductor components according to the prior art, a significant reduction of the channel resistance and hence of the total on resistance can be realized in a simple but nonetheless highly effective manner.

The present invention has been explained on the basis of the above description in such a way as to clarify the principle of the invention and its practical application. It goes without saying that a person of skill in the art can realize the present invention in various embodiments and modifications.

What is claimed is:

1. A field-effect-controllable semiconductor configuration, comprising:
   a semiconductor body;
   a source zone and a drain zone of a first conductivity type disposed in said semiconductor body;
   a body zone of a second conductivity type disposed between said source zone and said drain zone;
   a gate electrode having a surface being adjacent said body zone and being configured to form a channel zone in said body zone if a gate potential is applied to said gate electrode, said channel zone having a current flow in a direction substantially parallel to said surface of said gate electrode upon application of the gate potential;
   a dielectric insulating said gate electrode from said semiconductor body;
   at least a first region and a second region of the second conductivity type provided in said channel zone, said first region extending adjacent said surface of said gate electrode into a depth of said semiconductor body and being disposed substantially perpendicular to the direction of current flow in said channel zone;
   said first region having a first doping concentration, said second region having a second doping concentration, said second doping concentration being lower than said first doping concentration;
   said source zone, said drain zone, said body zone, and said gate electrode forming a semiconductor component having a threshold voltage and a given on resistance; and
   said first region and said second region being configured such that a combination of said first region and said second region results in the threshold voltage being greater than zero and in the given on resistance being lower than an on resistance resulting from a channel zone being doped with only one of said first doping concentration and said second doping concentration.

2. The semiconductor configuration according to claim 1, wherein said first region has a given thickness, said channel zone has a channel length, said given thickness is smaller than said channel length.

3. The semiconductor configuration according claim 1, wherein said first region is configured as a delta doping layer.

4. The semiconductor configuration according to claim 3, wherein said delta doping layer has a layer thickness in a range from a few atomic layers up to 20 nm.

5. The semiconductor configuration according to claim 3, wherein said delta doping layer has a doping density per unit area of greater than $10^{11}$ cm$^{-2}$.

6. The semiconductor configuration according to claim 3, wherein said delta doping layer has a doping concentration dimensioned such that a total quantity of doping atoms in said channel zone at least ensures a blocking capability of said semiconductor component, if said semiconductor component is in an off state.

7. The semiconductor configuration according to claim 1, wherein said second region has an intrinsic doping concentration which is lower than said first doping concentration by at least a factor of 100.

8. The semiconductor configuration according to claim 1, wherein said second doping concentration is lower than said first doping concentration by at least a factor of 100.

9. The semiconductor configuration according to claim 1, wherein said first region is provided within said channel zone and is spaced apart from said source zone via at least said second region.

10. The semiconductor configuration according to claim 1, including a further second region, said first region being provided within said channel zone and being spaced apart from said source zone via one of said second region and said further second region.

11. The semiconductor configuration according to claim 1, wherein said first region has a surface and is oriented within said channel zone such that, with a voltage applied between said drain zone and said source zone and with a gate potential applied to said gate electrode, a direction of current flow is substantially perpendicular to said surface of said first region.

12. The semiconductor configuration according to claim 1, wherein said semiconductor component is configured as a MOSFET.

13. The semiconductor configuration according to claim 1, wherein said semiconductor component is configured as a normally off MOSFET.

14. The semiconductor configuration according to claim 12, wherein said MOSFET is configured as a vertical transistor.

15. The semiconductor configuration according to claim 12, wherein said MOSFET is configured as a component selected from the group consisting of a D-MOSFET, a U-MOSFET, and a V-MOSFET.

16. The semiconductor configuration according to claim 12, wherein said MOSFET is configured as a mesa component.

17. The semiconductor configuration according to claim 12, wherein said MOSFET is formed with a trench, said gate electrode insulated via said dielectric is provided in said trench.

18. The semiconductor configuration according to claim 1, including a drift zone of the first conductivity type, said drift zone being provided between said body zone and said drain zone and being connected to said drain zone.

19. The semiconductor configuration according to claim 1, including:

further semiconductor components having respective channel zones and respective first regions and second regions of the second conductivity type provided in said channel zones; and said semiconductor component and said further semiconductor components forming a cell array, said cell array having a center region and an edge region, said first regions having thicknesses varying between said center region and said edge region.

20. The semiconductor configuration according to claim 1, including:

further semiconductor components having respective channel zones and respective first regions and second regions of the second conductivity type provided in said channel zones; and said semiconductor component and said further semiconductor components forming a cell array, said cell array having a center region and an edge region, said first regions having thicknesses decreasing from said center region to said edge region.

21. The semiconductor configuration according to claim 1, wherein said semiconductor component is configured as a smart power transistor.

* * * * *